United States Patent [19]

Okamoto et al.

[11] Patent Number: 5,208,534
[45] Date of Patent: May 4, 1993

[54] MAGNETIC RESONANCE IMAGING SYSTEM

[75] Inventors: Kazuya Okamoto, Yono; Kozo Satoh, Yokohama, both of Japan

[73] Assignee: Kabushiki Kaisha Toshiba, Kawasaki, Japan

[21] Appl. No.: 564,328

[22] Filed: Aug. 8, 1990

[30] Foreign Application Priority Data

Aug. 9, 1989 [JP] Japan ................................. 1-204760
Feb. 28, 1990 [JP] Japan ................................... 2-47814

[51] Int. Cl.⁵ .......................................... G01V 3/00
[52] U.S. Cl. .................................. 324/309; 324/307
[58] Field of Search ............... 324/300, 307, 309, 318, 324/322; 128/653.1, 653.2

[56] References Cited

U.S. PATENT DOCUMENTS

| | | | |
|---|---|---|---|
| 4,721,913 | 1/1988 | Hyde et al. ........................... | 324/318 |
| 4,825,162 | 4/1989 | Roemer et al. ..................... | 324/318 |
| 4,851,777 | 7/1989 | Macovski ............................ | 324/309 |
| 4,973,907 | 11/1990 | Bergman et al. ..................... | 324/318 |
| 5,086,275 | 2/1992 | Roemer ............................... | 324/318 |

FOREIGN PATENT DOCUMENTS

| | | |
|---|---|---|
| 0271123 | 6/1988 | European Pat. Off. . |
| 0293085 | 11/1988 | European Pat. Off. . |
| 62-41651 | 8/1986 | Japan . |
| 8905115 | 6/1989 | World Int. Prop. O. . |

Primary Examiner—Louis Arana
Attorney, Agent, or Firm—Oblon, Spivak, McClelland, Maier & Neustadt

[57] ABSTRACT

A magnetic resonance imaging system includes a magnetic field applying section for applying a static field, gradient field pulses, and an RF field to an object to be examined, a signal detecting section, including a homogeneous coil and a plurality of surface coils arranged to surround a desired region of the object, for detecting magnetic resonance signals from the object through the homogeneous coil and the surface coils, and an image data processing section for obtaining an image of the desired region by synthesizing image data based on the magnetic resonance signals respectively detected by the surface coils upon weighting/adding processing. The system uses differential surface coils as the surface coils. A magnetic resonance signal is detected through the homogeneous coil within the same time interval in which magnetic resonance signals are detected through the surface coils. Weighting functions for weighting-/adding processing of image data are determined on the basis of these magnetic resonance signals.

24 Claims, 12 Drawing Sheets

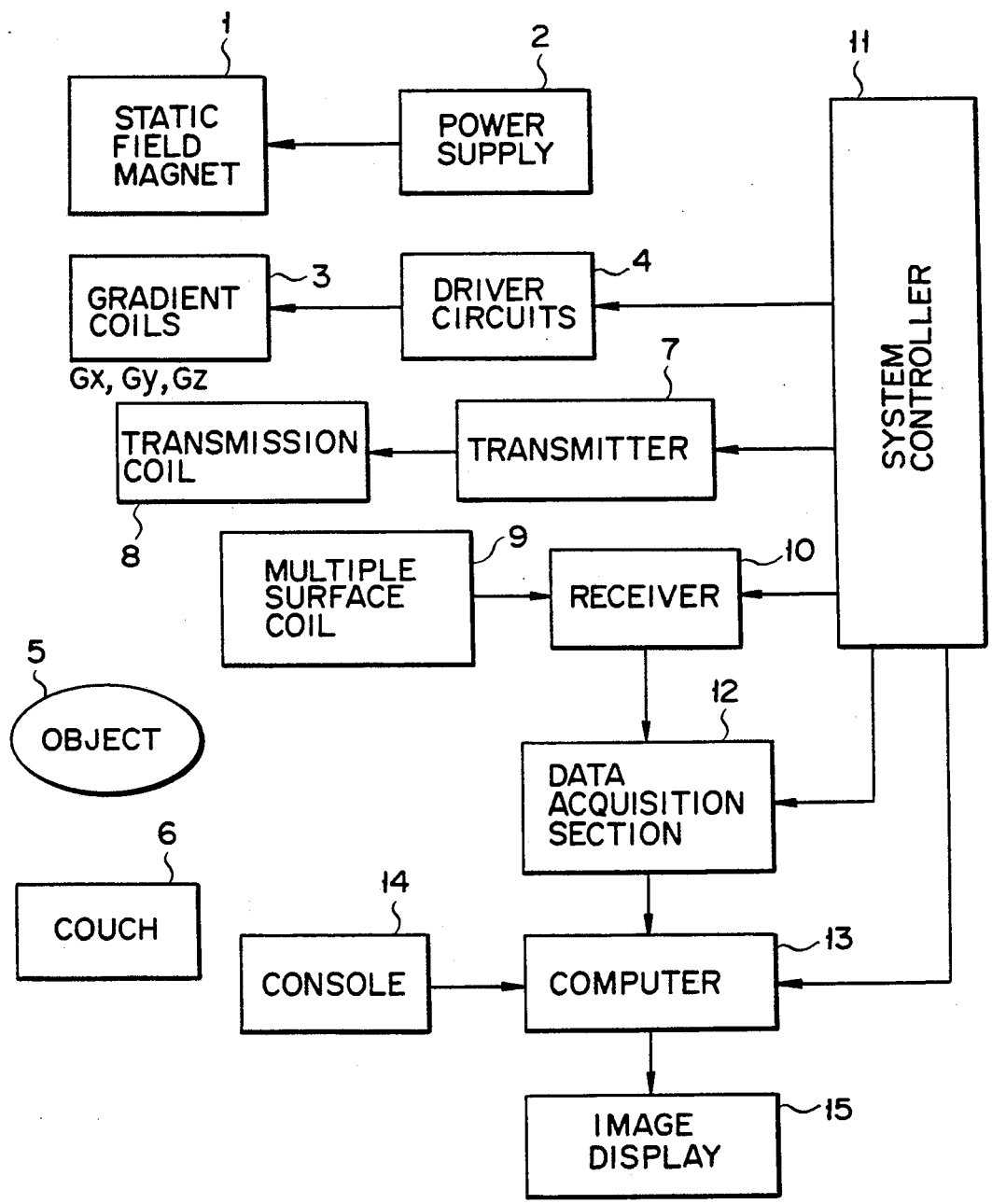
F I G. 1

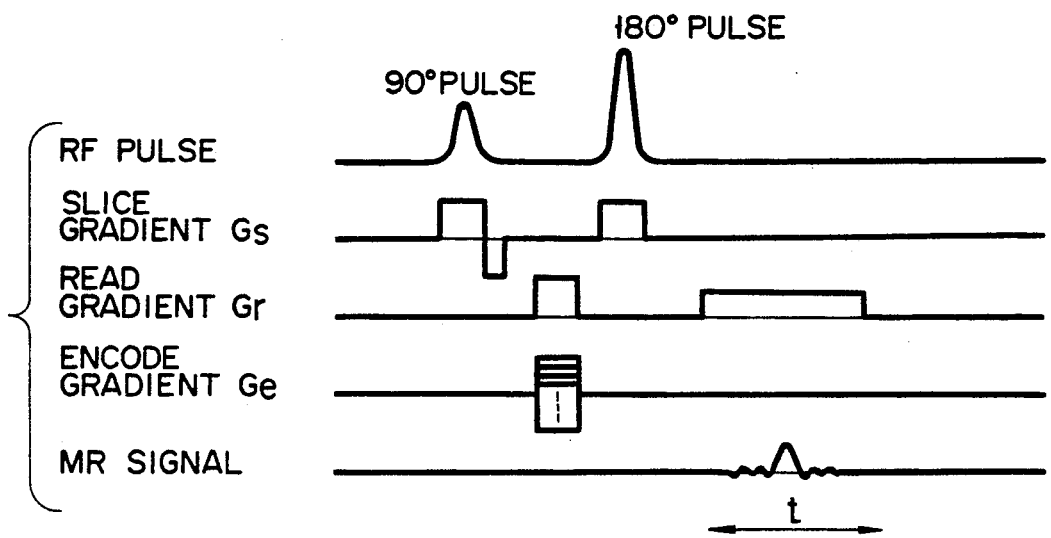
F I G. 11
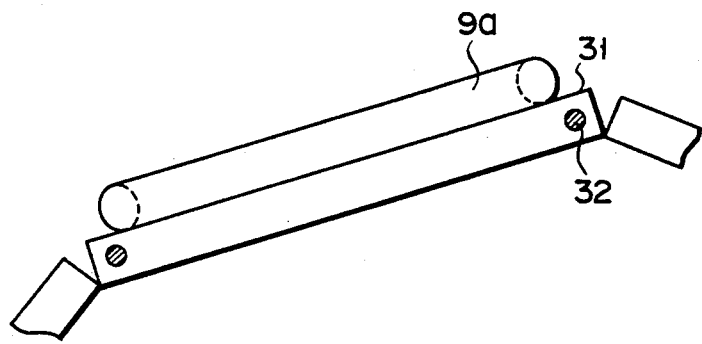
F I G. 12

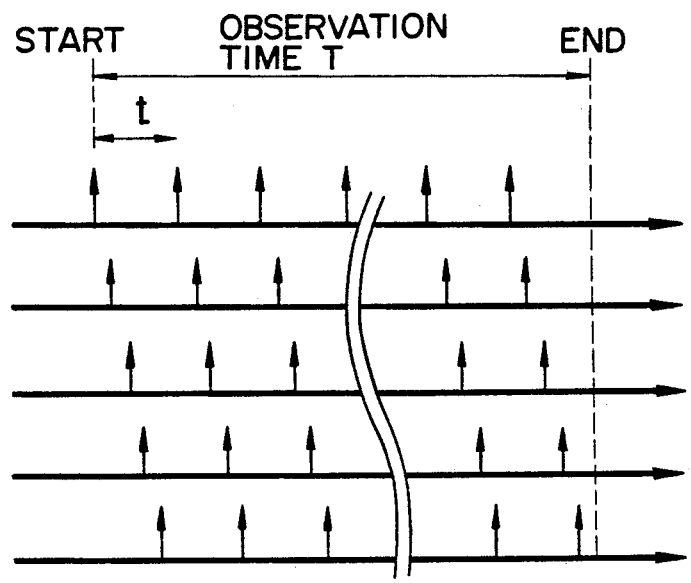
FIG. 13A
FIG. 13B
FIG. 13C
FIG. 13D
FIG. 13E
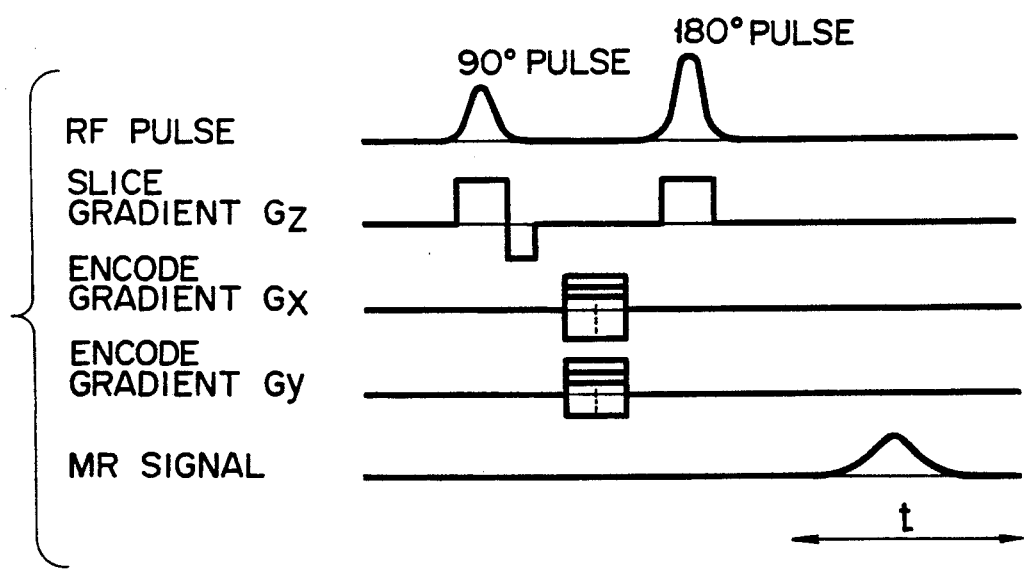
FIG. 14

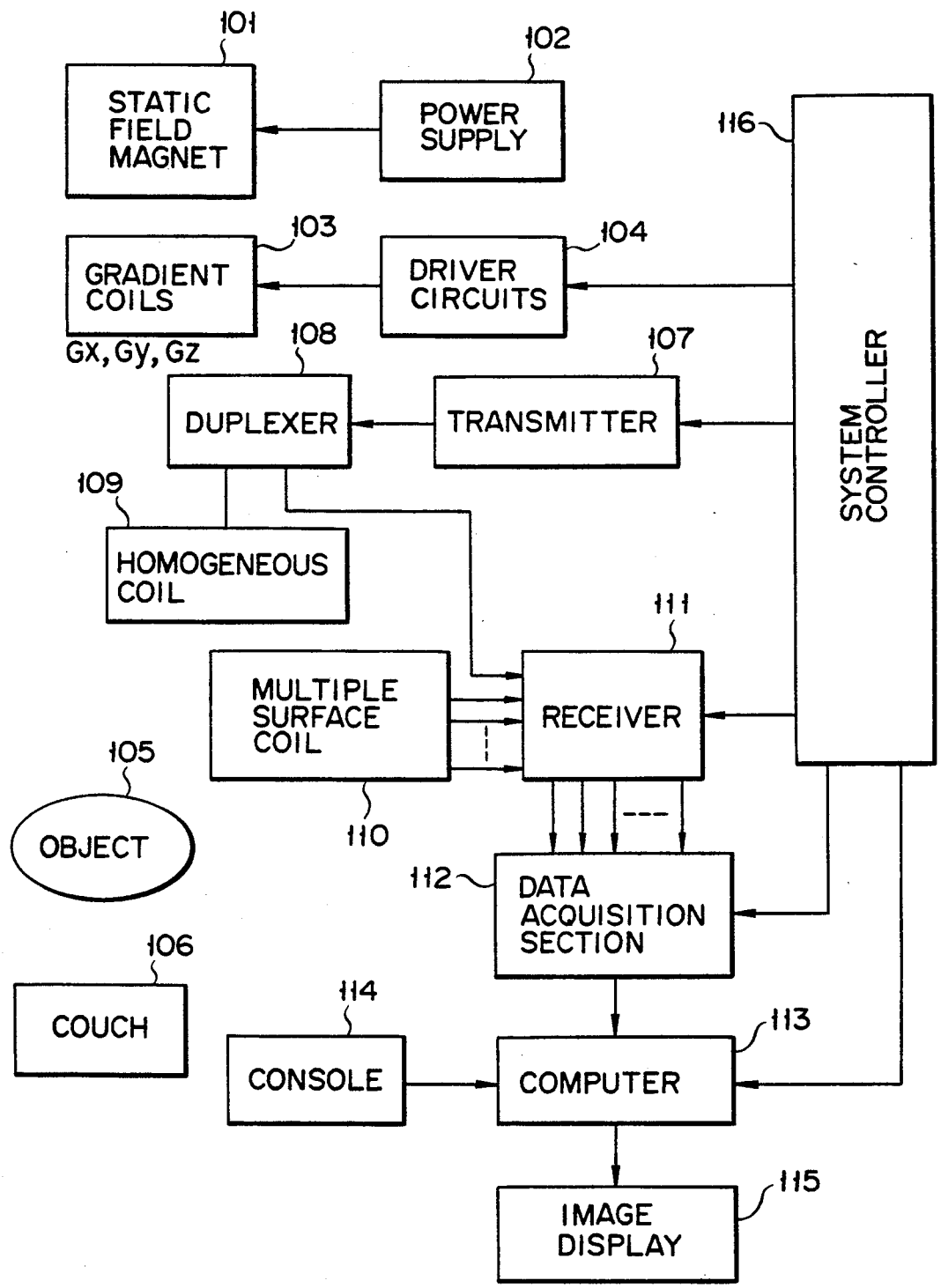
F I G. 15

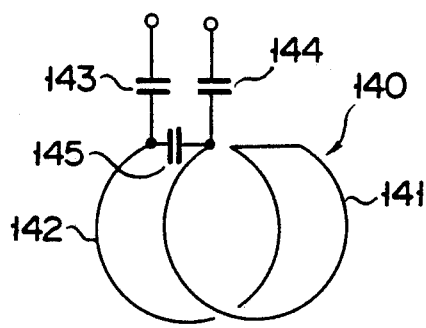
F I G. 18
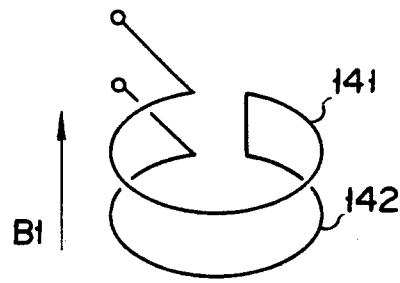
F I G. 19
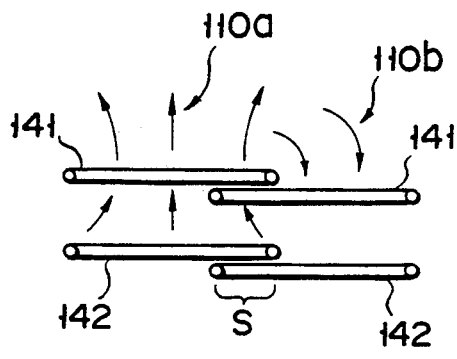
F I G. 20
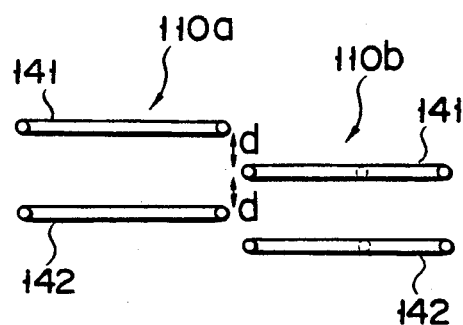
F I G. 21
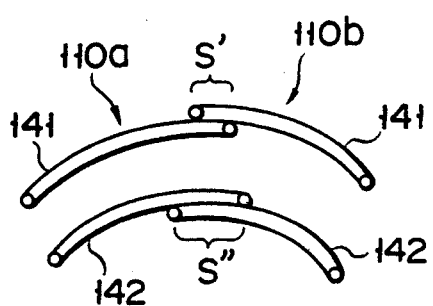
F I G. 22
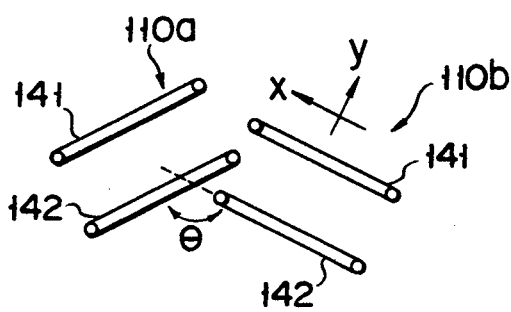
F I G. 23

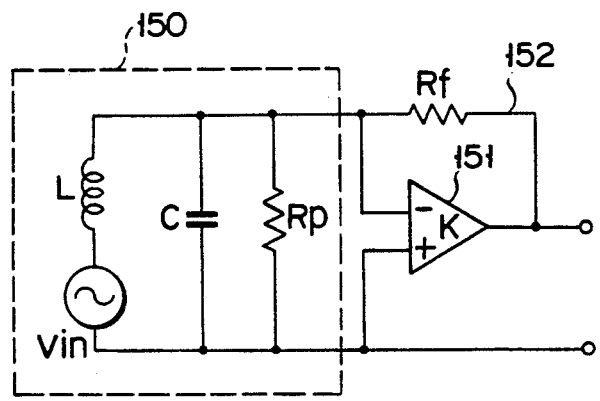
F I G. 24
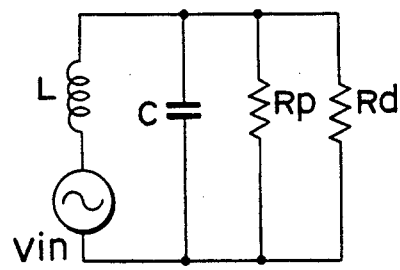
F I G. 25
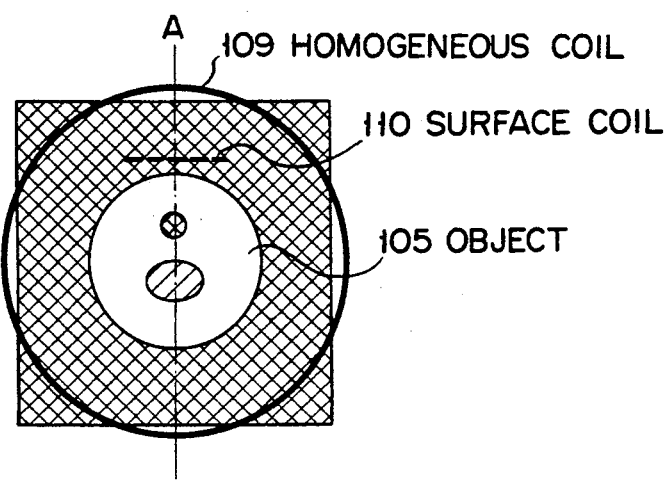
F I G. 26

MAGNETIC RESONANCE IMAGING SYSTEM

BACKGROUND OF THE INVENTION

1. Field of the Invention

The present invention relates to a magnetic resonance imaging (MRI) system and, more particularly, to an MRI system employing an image construction technique of obtaining an image having a high S/N (signal-to-noise) ratio by using so-called surface coils.

2. Description of the Related Art

An MRI system requires a relatively long imaging time, e.g., several minutes, for $^1H$ imaging. In spite of this drawback, an MRI system is considered as an almost perfect system. In $^1H$ imaging by means of the MRI system, specifically in imaging of a clinicaly stationary portion or a portion which moves slowly, an image having high quality which poses almost no practical problems can be obtained.

Recently, however, a great demand has arisen for high-speed imaging (imaging time: about 50 ms) capable of imaging quickly moving portions (e.g., heart), or imaging of nuclides other than $^1H$, e.g., $^{31}P$, $^{19}F$, $^{13}C$, and $^{23}N$. When these nuclides are to be imaged, an increase in S/N ratio is technically an important subject. For example, in high-speed imaging, a short imaging time poses the problem of decreasing the S/N ratio. In imaging of $^{31}P$, the S/N ratio is undesiraby decreased since the amount of $^{31}P$ in human body is as very small as about $10^{-4}$ of $^1H$.

In a conventional system, in order to increase the S/N ratio, a surface coil is used as a coil for receiving RF signals. The surface coil is brought into contact with a portion of interest of an object to be examined or a body surface near to the portion. The surface coil can detect signals from the portion in contact at a high S/N ratio. However, the drawback of this coil is that only an image near the portion in contact can be obtained. That is, the surface coil cannot perform imaging of an entire predetermined sectional plane of the object at a high S/N ratio. In a conventional method, one surface coil is used, imaging is performed while the position of the coil is sequentially changed, and images obtained at the respective positions are synthesized into an image of a predetermined sectional plane. This method requires complicated adjustment of the system to change the position of the surface coil, and the measuring time will be longer in proportion to an increase in the number of coil positions.

In order to solve such a problem, a technique disclosed in, e.g., U.S. Pat. No. 4,825,162 may be employed. In this technique, a plurality of surface coils are arranged around a desired imaging region of an object to be examined, and MR signals from the object are detected through these surface coils, respectivey. Imaging processing is performed for each of the detected MR signals to obtain image data of different series. Thereafter, pixel data corresponding to the same spatial positions are multiplied by predetermined weighting functions, which are determined in advance on the basis of the distributions of RF fields generated by the respective surface coils, and added, thereby forming data of each pixel. The obtained data are synthesized into an image of the desired region. With this operation, an image having a high S/N ratio can be obtained.

In addition, according to U.S. Pat. No. 4,825,162, since MR signals are simultaneously observed by the plurality of surface coils within the time required to obtain one-region (e.g., one-slice) image data, the technique includes a means for preventing the surface coils from steadily interfering with each other. More specifically, U.S. Pat. No. 4,825,162 discloses a decoupling technique for preventing mutual coupling of the coils. In this technique, the respective surface coils are arranged such that predetermined portions of adjacent surface coils overlap. With this arrangement, even if an RF current having a predetermined frequency flows in one surface coil, no RF current flows in other adjacent surface coils.

In U.S. Pat. No. 4,825,162, however, in order to determine weighting functions in advance, the distributions of RF fields generated by the respective surface coils upon supplying of RF currents thereto must be obtained in advance. In order to obtain the above-mentioned RF field distributions by a computer simulation, the structure, conductivity, and dielectric constant of the object must be obtained. That is, the RF field distributions cannot be easily obtained by a computer simulation. Furthermore, in order to obtain RF field distributions by experiments, homogeneous image data of an entirely desired region to be imaged must be obtained by using, e.g., a homogeneous coil as a transmission coil. This requires an extra period of time.

Furthermore, in U.S. Pat. No. 4,825,162, even if weighting functions are obtained in advance, since weighting/adding processing is performed after Fourier transform of MR signals obtained by the respective surface coils is performed, and a reconstructed image of each surface coil is obtained, Fourier transform processing corresponding to the number of surface coils must be performed.

As described above, in the conventional system, MR signals are simultaneously acquired by using a plurality of surface coils, and an image having a high S/N ratio is obtained by reconstructing images corresponding to the respective surface coils upon Fourier transform of the obtained image data, and performing weighting/adding processing of the reconstructed images. In this system, weighting functions must be determined in advance on the basis of the distributions of RF fields generated by the respective surface coils, and weighting/adding processing is performed after images corresponding to the respective surface coils are reconstructed. For this reason, the conventional system requires an extra processing time and extra processing, and also requires a complex circuit.

SUMMARY OF THE INVENTION

It is an object of the present invention to provide a magnetic resonance imaging system which can obtain an image having a high S/N ratio by simultaneously detecting magnetic resonance signals by using a plurality of surface coils, and performing weighting/adding processing of obtained image data, and can easily obtain an image having a high S/N ratio within a short period of time.

According to the first aspect of the present invention, there is provided a magnetic resonance imaging system comprising a magnetic field applying section for applying a static field, gradient field pulses, and an RF field to an object to be examined so as to cause magnetic resonance in an imaging region of the object, a plurality of signal detecting sections, including a plurality of surface coils arranged to surround the region of the object, for detecting magnetic resonance signals from the object through the surface coils, and an image data processing section for performing convolution integration of the magnetic resonance signals respectively detected by the signal detecting sections and an inverse Fourier transform result of a weighting function defined in advance as a spatial position function for each of the surface coils, for additively synthesizing convolution integration results obtained by the convolution integration and corresponding to the signal detecting sections, and for obtaining an image of the imaging region by performing Fourier transform of data obtained by the additive synthesis.

According to the second aspect of the present invention, in a magnetic resonance imaging system, differential surface coils are used as a plurality of surface coils, a magnetic resonance signal is detected through a homogeneous coil, which is mainly used as a transmission coil in a conventional system, within the same time as required to detect magnetic resonance signals through the surface coils, and data required to determine weighting functions for weighting/adding processing of image data, e.g., the RF field distributions of the surface coils, are obtained on the basis of an image obtained by performing Fourier transform of the detected magnetic resonance signals.

According to the first aspect of the present invention, weighting functions are obtained in advance. If the inverse Fourier transform results of the weighting functions are obtained in advance, instead of performing weighting/adding processing after Fourier transform of magnetic resonance data obtained by each surface coil is performed to obtain a reconstructed image of each surface coil, the following processing can be performed: performing convolution integration of the respective magnetic resonance signals detected by the surface coils and the inverse Fourier transform results of the weighting functions respectively corresponding to the surface coils, additively synthesizing the convolution integration result corresponding to the surface coils, and performing Fourier transform of the result. In this technique, Fourier transform processing is required only once.

According to the second aspect of the present invention, since a magnetic resonance signal is received through the homogeneous coil within the same time as required to detect magnetic resonance signals through the surface coils, images having high S/N ratios can be obtained by the surface coils, and homogeneous image data of a desired imaging region of an object to be examined can be obtained. Therefore, the RF field distributions of the respective surface coils can be obtained by using these image data. With this operation, an image having a high S/N ratio can be obtained by multiplying the images obtained by performing Fourier transform of the magnetic resonance signals obtained by the surface coils by the weighting functions corresponding to the RF field distributions, and adding the data in units of pixels, or, performing convolution integration of the respective magnetic resonance signals detected by the surface coils and the inverse Fourier transform results of the weighting functions respectively corresponding to the surface coils, additively synthesizing the convolution integration result corresponding to the surface coils, and performing Fourier transform of the result.

In addition, when image data obtained by simple weighting/adding processing is inhomogeneous, homogeneous data can be obtained by performing sensitivity correction on the basis of the RF field distributions obtained by the respective surface coils.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing an arrangement of an MRI system according to the first embodiment of the present invention;

FIG. 11 is a timing chart showing a pulse sequence for imaging in the system in FIG. 1;

FIG. 12 is a view showing a method of positioning a surface coil;

FIGS. 13A to 13E are timing charts for explaining another operation of the system in FIG. 1;

FIG. 14 is a timing chart showing another pulse sequence for imaging in the system in FIG. 1;

FIG. 15 is a block diagram showing an MRI system according to the second embodiment of the present invention;

FIG. 18 is a view showing a detailed arrangement of a surface coil;

FIG. 19 is a view for explaining the principle of a differential coil constituting the surface coil in FIG. 18;

FIGS. 20 to 23 are views respectively showing decoupling methods using the surface coil in FIG. 18;

FIG. 24 is a circuit diagram showing a Q damp circuit for decoupling;

FIG. 25 is an equivalent circuit diagram of the circuit in FIG. 24;

FIG. 26 is a view showing an image obtained through the homogeneous coil in the system in FIG. 15;

DETAILED DESCRIPTION OF THE PREFERRED EMBODIMENT

Figure 2:
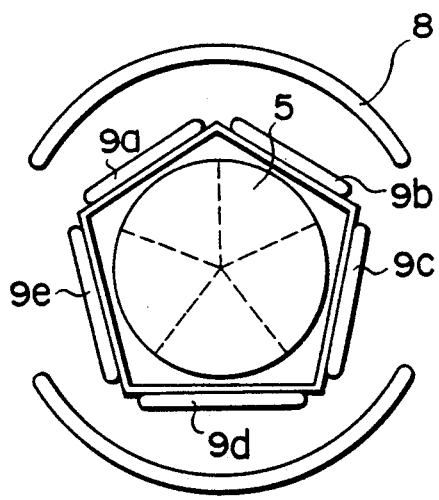
FIG. 2 is a view showing a multiple surface coil for signal detection in the system in FIG. 1.

FIG. 1 is a block diagram showing an arrangement of an MRI system according to the first embodiment of the present invention.

A static field magnet 1 is an electromagnet to be excited by a power supply 2. The static field magnet 1 applies a homogeneous static field to an object to be examined 5. Gradient field coils 3 are driven by driver circuits 4. The driver circuits 4 are controlled by a system controller 11. The gradient field coils 3 apply X-, Y-, and Z-gradient fields Gx, Gy, and Gz, whose field intensities are linearly gradually changed in or- thogonal X and Y directions in a sectional plane of interest, i.e., a slice plane and a Z direction (orthogonal to both the X and Y directions) perpendicular to the slice plane, to the object 5 (e.g., a human body) lying on a bed 6. In addition, an RF field is applied to the object 5. The RF field is generated by an RF signal output from a transmitting section 7 through a transmission coil 8 under the control of the system controller 11.

A signal detection multiple surface coil 9 receives an MR signal generated in the object 5 by magnetic reso- nance. The received MR signal is amplified and de- tected by a receiving section 10 and is subsequently transmitted to a data acquiring section 12 under the control of the system controller 11. The data acquiring section 12 acquires the MR signal input from the receiv- ing section 10, A/D-converts the signal, and sends it to a computer 13.

The computer 13 is controlled through a console 14 operated by an operator so a to obtain image data of different series by performing image reconstruction of MR signals input from the data acquiring section 12. In addition, the computer 13 controls the system control- ler 11. The image data obtained by the computer 13 are supplied to an image display 15, and a corresponding image is displayed.

The transmission coil 8 serves to apply an RF field to an entire region (to be imaged) of the object 5, and is arranged to surround the object 5. As the transmission coil 8, a saddle coil or a distributed constant type coil is used.

As shown in FIG. 2, the multiple surface coil 9 is constituted by a plurality (five in this case) surface coils 9a to 9e arranged to surround the region (to be imaged) of the object 5.

Figure 3:
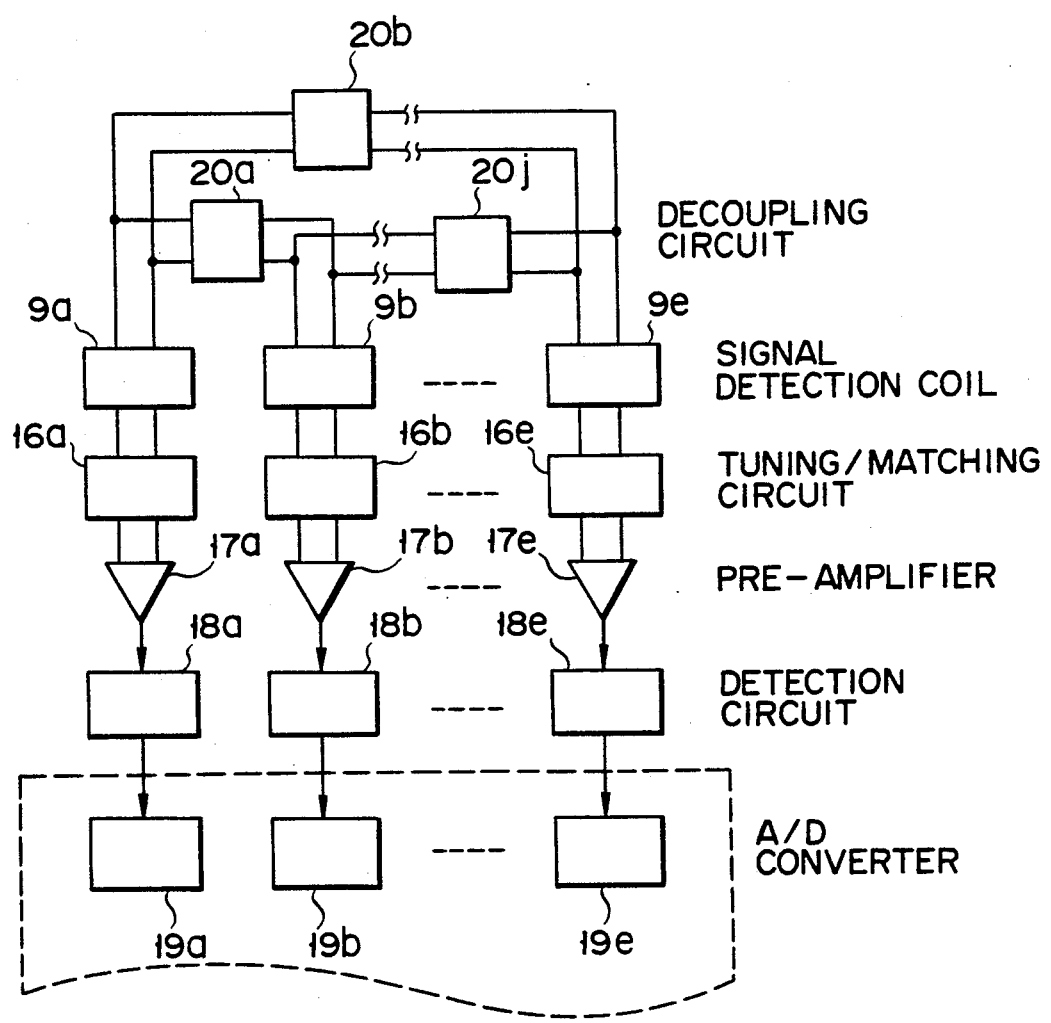
FIG. 3 is a bock diagram showing a detailed arrangement of a receiving section in the system in FIG. 1.

FIG. 3 shows a detailed arrangement of the receiving section 10 in FIG. 1. The surface coils 9a to 9e are respectively connected to signal detecting sections, which are respectively obtained by sequentially con- necting tuning/matching circuits 16a to 16e, preamplifi- ers 17a to 17e, and detectors 18a to 18e together. Detec- tion outputs of MR signals output from the detectors 18a to 18e are converted into digital data by A/D (ana- log-to-digital) converters 19a to 19e in the data acquir- ing section 12, and are fetched by the computer 13 shown in FIG. 1.

Figure 4A:
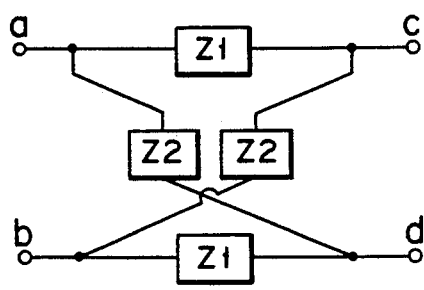
FIGS. 4A and 4B are a block diagram showing a bridge circuit constituting a decoupling circuit in the arrangement in FIG. 3 and an equivalent circuit diagram thereof.
Figure 4B:
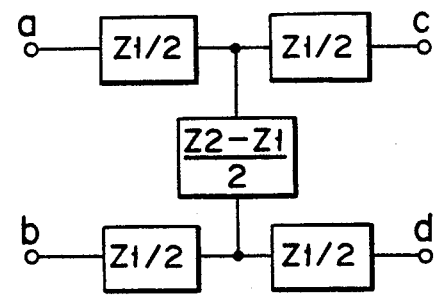
Figure 5:
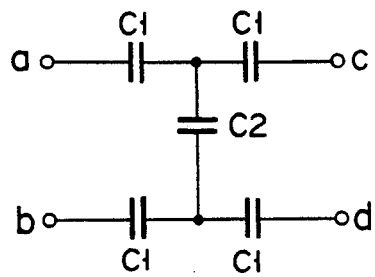
FIGS. 5 and 6 are circuit diagrams showing the bridge circuit in FIG. 4B concretely.
Figure 6:
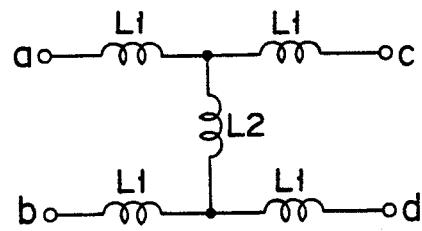

Decoupling circuits 20a to 20j are respectively ar- ranged between the signal detecting coils 9a to 9e so as to prevent the coils from being steadily coupled to each other. Each of the decoupling circuits 20a to 20j may be constituted by, e.g., a bridge circuit shown in FIG. 4, which consists of two types of reactance elements Z1 and Z2. FIG. 4B is an equivalent circuit of the bridge circuit in FIG. 4A. The reactance elements Z1 and Z2 may be constituted by capacitors C1 and C2 as shown in FIG. 5, or may be constituted by inductors L1 and L2 as shown in FIG. 6, and the effect of coupling is can- celed by adjusting the values of these elements.

Figure 7:
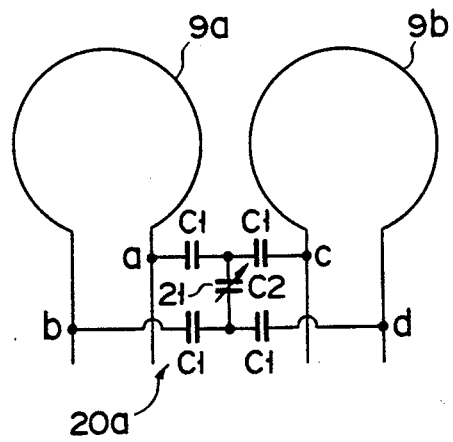
FIG. 7 is a circuit diagram showing a decoupling circuit using the bridge circuit in FIG. 5.

FIG. 7 shows a state wherein a decoupling circuit constituted by such a bridge circuit is actually con- nected between surface coils. Each of pairs of terminals a and b and terminals c and d are respectively connected to the two ends of a corresponding one of two surface coils (e.g., 9a and 9b in FIG. 7) to be decoupled. Decou- pling is performed by adjusting the value of a capacitor 21. This circuit is required for each pair of coils to be decoupled. That is, n(n−1)/2 circuits are required for n surface coils.

Figure 8:
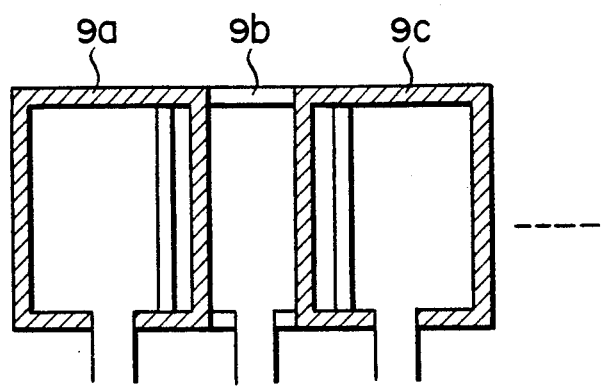
FIG. 8 is a view showing another decoupling means.

FIG. 8 shows a decoupling method without any spe- cial decoupling circuit. In this method, the adjacent surface coils 9a to 9e are designed to partially overlap, and decoupling is performed by adjusting the degree of overlapping.

Figure 9:
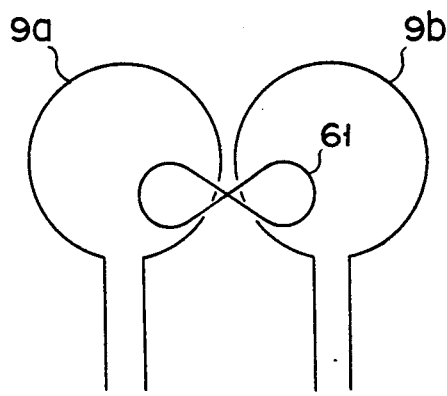
FIG. 9 is a view showing a method of performing decoupling between surface coils by using a decoupling coil.

FIG. 9 shows a state wherein a butterfly, i.e., figure-8-shaped decoupling coil 61 is coupled to the adjacent surface coils 9a and 9b. With this arrangement, a mag- netic flux flowing between the coils 9a and 9b can be canceled.

Figure 10:
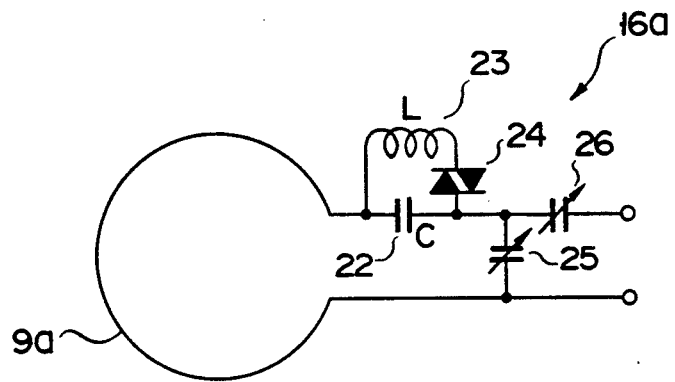
FIG. 10 is a circuit diagram showing a circuit for causing a surface coil to be insensitive to a transmission coil during a transmitting operation.

Assume that the surface coils 9a to 9e respond to the transmission coil 8 in the transmission mode. In this case, when an RF current flows in the transmission coil 8, currents also flow in the surface coils 9a to 9e, thus disturbing the spatial distribution of an RF field formed by the transmission coil 8. FIG. 10 shows a means for preventing this. In the tuning/matching circuit 16 (16a to 16e), a circuit constituted by a trap capacitor 22, a trap inductor 23, and a cross diode 24 is inserted. The capacitor 22 and the inductor 23 are adjusted to reso- nate at a predetermined magnetic resonance frequency $f_0$. Capacitors 25 and 26 are matching capacitors. In the transmission mode, part of an RF field generated by the transmission coil 8 links to the surface coil 9 (9a to 9e) inductor 23, so that a high voltage is applied to both terminals of the cross diode 24, and the cross diode is set in an ON state. As a result, a high impedance is set in the capacitor 22, and the surface coil 9 (9a to 9e) is discon- nected from the preamplifier 17 (17a to 17e). When an MR signal is to be detected, a low voltage is applied across the cross diode 24, and the cross diode 24 is turned off. Therefore, a signal detected by the surface coil 19 is transmitted to the preamplifier 17.

Note that a PIN diode may be used in place of the cross diode 24. In this case, the PIN diode is set in an ON state only in the transmission mode, and is set in an OFF state in other modes. It is required that the trans- mission coil 8 is set to insensitive to the surface coil 9 in the reception mode. For this purpose, an inductor-capacitor parallel circuit using a PIN diode is inserted in series with the transmission coil 8 and is designed o be set in an OFF state only in the transmission mode and to be set in an ON state in other modes.

An imaging sequence in this embodiment will be described below. MR signals are observed by using the surface coils 9a to 9e in accordance with a normal imaging sequence. FIG. 11 shows an imaging sequence. This imaging sequence is a pulse sequence for obtaining a two-dimensional image by a known spin echo method using 90°–180° pulses as an RF field. Referring to FIG. 11, reference symbols Gs, Gr, and Ge respectively denote the application timings of a slicing gradient field, a read gradient field, and an encoding gradient field. MR signals are acquired by repeatedly executing the sequence shown in FIG. 11 while the amplitude of the encoding gradient field Ge is changed. Signals obtained by the surface coils 9a to 9e are respectively subjected to two-dimensional Fourier transform so as to obtain two dimensional image data corresponding to five images.

A method of reconstructing the above five-image data as one-image data will be described below.

In general, a weighting function $F_i(x,y)$ is set in advance for each pixel data of image data obtained through a surface coil i. Each pixel data $I_i(x,y)$ is multiplied by this function. The multiplication result is then added by n times corresponding to the number of surface coils 9a to 9e so as to obtain a value I'(x,y), thus reconstructing n-image data as one-image data. This operation can be represented by the following equation:

$$I'(x,y) = \sum_{i=1}^{n} F_i(x,y) \cdot I_i(x,y) \quad (1)$$

Instead of obtaining the sum, its average value I''(x,y) may be obtained as follows:

$$I''(x,y) = \sum_{i=1}^{n} F_i(x,y) \cdot I_i(x,y) / \sum_{i=1}^{n} F_i(x,y) \quad (2)$$

If noise components detected by the surface coils 9a to 9e have no correlation, the S/N of I'(x,y) or I''(x,y) can be defined by the proportion of a signal and a normal deviation $\sigma_i$ of the noise as follows:

$$S/N = P(x,y) \cdot \quad (3)$$

$$\left( \sum_{i=1}^{n} F_i(x,y) \cdot S_i'(x,y) \right) / \left( \sum_{i=1}^{n} F_i(x,y) \cdot F_i(x,y)^* \sigma_i^2 \right)^{\frac{1}{2}}$$

for $$I_i(x,y) = P(x,y) \cdot S_i'(x,y) \quad (4)$$

(where $S_i'(x,y)$ is an RF field distribution obtained when an RF current flows in each surface coil 9, and P(x,y) is an amount independent of each surface coil, i.e., dependent on a spin density and longitudinal and transverse relaxation times T1 and T2.)

The value of $F_i(x,y)$ at which the maximum S/N ratio is obtained is obtained according to equation (3) as follows:

$$F_i(x,y) = A \cdot \frac{S_i'(x,y)}{\sigma_i^2} \quad (5)$$

where $1 \leq i \leq n$, and A is a constant independent of i.

Equation (5) indicates that $F_i(x,y)$ is proportional to an RF field distribution normalized by the square of the normal deviation of the noise of the image obtained by the coil i. In other words, if the gain of each image is adjusted to set $\sigma_1 = \ldots = \sigma_i = \ldots = \sigma_n$, $F_i(x,y)$ is proportional to the RF field distribution.

The meaning of the weighting function $F_i(x,y)$ in the RF field distribution will be described below.

Assume that phantoms are arranged to be symmetrical with respect to the axes of the surface coils 9a to 9e, and imaging is performed by performing phase correction of real and imaginary parts of MR signals detected by the surface coils 9a to 9e when the phantoms are uniformly excited by the transmission coil 8. In this case, the weighting function $F_i(x,y)$ represents an RF field component distribution in the axial direction of each surface coil.

When phase correction of each pixel data of the obtained image data is to be two-dimensionally performed to set the imaginary part to be zero, the weighting function must be the distribution of the RF field intensity. If the symmetry of the surface coils is poor, or the positions of phantoms are not symmetrical with respect to the axes of the surface coils, real and imaginary parts of the image data is changed, and the weighting function must be changed accordingly. In practice, however, even if the weighting function is not strictly set in this manner the effect of increasing the S/N ratio is not considerably reduced. An RF field distribution obtained by each surface coil can be obtained in advance by a computer simulation or measurement by an magnetic resonance imaging method.

It is important to use a weighting function proportional to an RF field spatial distribution.

When an RF field distribution is to be obtained by a computer simulation, the position of each surface coil must be obtained. According to one method, the position of each surface coil is measured after it is fixed. According to another method, as shown in FIG. 12, phantoms are arranged at stationary positions with respect to the surface coil 9a, e.g., positions on a surface coil fixing base 31, and imaging of the phantoms 32 is performed simultaneously with imaging of the object 5 so that the position of the surface coil can be determined with reference to the positions of the phantoms on the image. As the phantom 32, a nuclide different from a nuclide as an object to be measured in the object 5 may be used. For example, when high-S/N imaging of $^{31}P$ is to be performed, since $^{1}H$ coils are also used to position an object to be examined, $^{1}H$ phantoms may be used.

If the sensitivity regions of the surface coils 9a to 9e do not greatly overlap, since noise components induced from the object 5 by the coils 9a to 9e have low correlation, MR signals detected by the coils 9a to 9e may be simultaneously observed. If, however, the sensitivity regions overlap, the correlation between noise components induced from the object 5 by the surface coils 9a to 9e is increased. In order to prevent such a state, the sampling timings of signals from the surface coils 9a to 9e are preferably shifted from each other in the range of a sampling interval determined by the band width of an image. The reason for such an operation will be described below with reference to FIGS. 13A to 13E. Assume that an MR signal for every encoding operation is observed by, e.g., the surface coil 9a with a sampling interval (sampling time) Δt and an observation time T as shown in FIG. 13A. In observation by means of the coil 9b, as shown in FIG. 13B, the observation time is not changed, but the sampling start time is slightly shifted.

In observation by means of the coils 9c to 9e, as shown in FIGS. 13C to 13E, the sampling start time is shifted little by little. This reduces the correlation between noise components detected by the coils 9a to 9e, and hence the S/N ratio upon weighting can be increased.

In this embodiment, MR signals detected by the respective surface coils are simutaneously observed. However, the processing of obtaining a sum or an average addition value by using a weighting function can be effectively applied to a case wherein the respective surface coils are not simultaneously used, and independently obtained images are synthesized.

Furthermore, in this embodiment, a two-dimensional image is obtained. The present invention can be applied to a case wherein a three-dimensional image is obtained. In this case, a three-variable function corresponding to a three-dimensional image is used as a weighting function.

Moreover, the present invention can be applied to chemical shift imaging. For example, if a three-dimensional sequence including a two-dimensional space $(x-y)$ and a chemical shift axis $(\omega\delta)$ is used, as shown in FIG. 14, since a weighting function has a value with respect to a space, a function having two variables corresponding to a two-dimensional space is sued. A practical weighting/adding method of obtaining a simple sum and its average value can be represented by the following equations:

$$\Gamma(x,y,\omega\delta) = \sum_{i=1}^{n} F_i(x,y) \cdot I_i(x,y,\omega\delta) \tag{6}$$

$$\Gamma'(x,y,\omega\delta) = \sum_{i=1}^{n} F_i(x,y) \cdot I_i(x,y,m\omega\delta) / \sum_{i=1}^{n} F_i(x,y) \tag{7}$$

In the above-described embodiment, an image having a high S/N is obtained by performing a weighting/adding operation using images obtained by performing Fourier transform of raw data obtained by the respective surface coils. However, an image having a high S/N ratio can also be obtained by performing convolution integration of raw data before Fourier transform and a inverse Fourier transform results of weighting function so as to add the raw data from the respective coils, and performing Fourier transform of the sum.

Assume that a two-dimensional image is to be obtained. Also assume that raw data obtained by an ith signal detecting coil is represented by $I_{fi}(Kx,Ky)$;, image data after Fourier transform, by $I_i(X,Y)$; the inverse Fourier transform result of a weighting function of an ith image, by $k_{fi}(Kx,Ky)$; a weighting function, by $k_i(X,Y)$; and a finally obtained high-S/N image, by $I(X,Y)$. In this case, the following relation can be established:

$$I(X,Y) = \sum_i K_i(X,Y) \cdot I_i(X,Y)$$

$$\int\int I(X,Y)e^{-i(Kx\cdot X + Ky\cdot Y)}dxdy$$

$$= \sum_i \int\int k_i(X,Y)I_i(X,Y)e^{-i(Kx\cdot X + Ky\cdot Y)}dxdy$$

$$= \sum_i \int\int k_{fi}(Kx',Ky')I_{fi}(Kx - Kx', Ky - Ky')dKx'dKy'$$

As is apparent from the above equation, data obtained by adding convolution integration result of the raw data $I_{fi}(Kx,Ky)$ and the inverse Fourier transform result $k_{fi}(Kx,Ky)$ of the weighting function by the number of times corresponding to the number of coils corresponds to the inverse Fourier transform result of the finally obtained image $I(X,Y)$. By performing Fourier transform of this data, the image $I(X,Y)$ can be obtained.

FIG. 15 shows an arrangement of an MRI system according to the second embodiment of the present invention.

A static field magnet 101 is excited by a power supply 102 so as to apply a homogeneous static field to an object 105 to be examined. Gradient field coils 103 are driven by driver circuits 104 controlled by a system controller 116 so as to apply gradient fields Gx, Gy, and Gz to the object 105 (e.g., a human body) on a couch 106. In addition, an RF field is applied to the object 105. The RF field is generated when an RF pulse from a transmitting section 107 is applied to a homogeneous coil 109 (which is used as a transmission/reception coil) through a duplexer 108. The operations of the transmitting section 107 and the duplexer 108 are controlled by the system controller 116.

A multiple surface coil 110 as a signal detecting coil is arranged inside the homogeneous coil 109 so as to be close to the object 105. MR signals from the object 105 are respectively received by the homogeneous coil 109 and the multiple surface coil 110. The MR signal received by the homogeneous coil 109 is supplied to a receiving section 111 through the duplexer 108. The MR signals received by the multiple surface coil 110 are directly supplied to the receiving section 111. The duplexer 108 serves to switch the transmission and reception modes of the homogeneous coil 109. In the transmission mode, the duplexer 108 transfers an RF pulse from the transmitting section 107 to the homogeneous coil 109. In the reception mode, the duplexer 108 introduces a reception signal from the homogeneous coil 109 to the receiving section 111.

Each MR signal is amplified and detected by the receiving section 111 and is supplied to a data acquisition section 112. MR signal transfer from the receiving section 11 to the data acquisition section 112 is controlled by the system controller 116. The data acquisition section 112 acquires the MR signals through the receiving section 111, A/D-converts them, and sends them to a computer 113. These operations are also controlled by the system controller 116.

The computer 113 is connected to a console 114, and serves to perform image reconstruction of the MR signals input from the data acquiring section 112. After obtaining image data corresponding to the number of coils of the multiple surface coil 110, the computer 113 performs a weighting/adding operation of these image data so as to synthesize the data into image data for forming a one-frame image. The computer 113 also serves to control the system controller 116. The image data obtained by the computer 113 is supplied to an image display 115 and is displayed.

Figure 16:
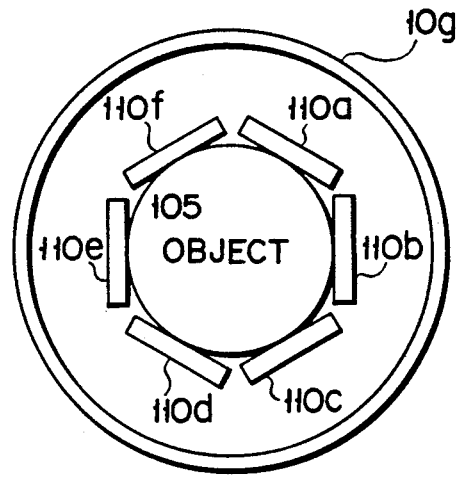
FIG. 16 is a sectional view showing a schematic arrangement of a homogeneous coil and a multiple surface coil with respect to an object to be examined in the system in FIG. 15.

FIG. 16 is a schematic view showing the arrangement of the homogeneous coil 109 and the multiple surface coil 110. The homogeneous coil 109 applies a homogeneous RF field to an entire region (to be imaged) of the object 105, and detects an RF signal from the object 105. The homogeneous coil 109 is arranged to surround the object 105. The homogeneous coil 109 is a coil capable of generating a homogeneous RF field in a given region. More specifically, as the homogeneous coil 109, a saddle coil, a distributed-constant type coil (birdcage coil), or a quadrature coil constituted by saddle or distributed constant type coil is used. The multiple surface coil 110 is arranged inside the homogeneous coil 109 and is constituted by a plurality of (six in this case) surface coils 110a to 110f which are arranged near the object 105 so as to surround the region to be imaged.

Figure 17:
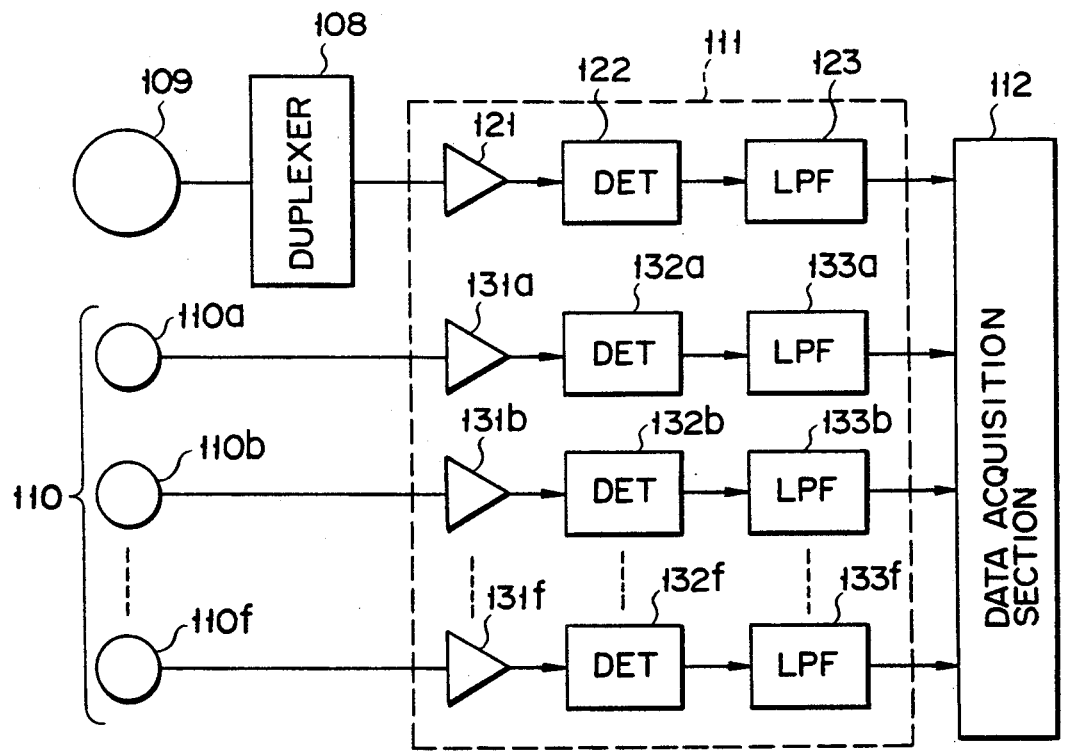
FIG. 17 is a block diagram showing a detailed arrangement of a receiving section in the system in FIG. 15.

FIG. 17 shows in more detail the structure of the receiving section 111 in FIG. 15. A first signal detection section constituted by a preamplifier 121, a detector (DET) 122, and a low-pass filter (LPF) 123 is arranged for the homogeneous coil 109. Preamplifiers 131a to 131f, detectors 132a to 132f, and low-pass filters 133a to 133f, which constitute a second signal detecting section, are arranged for the surface coils 110a to 110f, respectively. The surface coils 110a to 110f respectively correspond to the preamplifiers 131a to 131f, the detectors 132a to 132f, and the low-pass filters 133a to 133f. With this arrangement, MR signals respectively received by the homogeneous coil 109 and the surface coils 110a to 110f are independently amplified by the preamplifiers 121 and 131a to 131f. The amplified signals are independently detected by the detectors 122 and 132a to 132f. Unnecessary frequency components are removed from the signals by the low-pass filters 123 and 133a to 133f, respectively. Thereafter, the MR signals are input to the data acquisition section 112.

The data acquisition section 112 samples/holds the outputs supplied from the receiving section 111 and A/D converts the outputs. The image reconstruction data is fetched by the computer 113 shown in FIG. 15. The data acquisition section 112 may use either of the following two data acquiring schemes. In one scheme, all low-pass filter outputs in the receiving section 111 are sampled/held at a sampling interval ($\Delta t$) determined by the band width of an image to be acquired, and each sample/hold output is scanned at the sampling interval $\Delta t$ so as to digitize it. In the other scheme, each lowpass filter output is sequentially sampled/held at the sampling interval $\Delta t$ to digitize it.

Since the homogeneous coil 109 and the surface coils 110a to 110f are arranged to be close to each other, decoupling between them is required. In order to perform this decoupling, for example, a differential coil 140 shown in FIG. 18 is used as a surface coil. As is apparent from the principle shown in FIG. 19, the differential coil 140 is designed such that two identical ring-like coils 141 and 142 are arranged to be coaxial and parallel to each other, and is connected to cause currents to flow in spatially opposite directions. (The shape of each identical coil is not limited to a ring-like shape.) The differential coil 140 has the same composition that of a differential coil used for a conventional SQUID (superconducting quantum interference device) detector. One surface coil unit is constituted by this differential coil 140 and a tuning/matching circuit consisting of capacitors 143 to 145 connected to the two ends of the coil 140. The tuning/matching circuit is connected to a preamplifier in the receiving circuit 111. A surface coil constituted by such a differential coil will be referred to as a differential surface coil hereinafter.

When a spatially homogeneous RF field B1 generated by the homogeneous coil 109 links the differential sur face coil having the above-described arrangement, identically induced electromotive forces tend to be generated in the two coils 141 and 142. Owing to the above-mentioned connection between the coils 141 and 142, however, the electromotive forces induced by the coils 141 and 142 cancel each other, and hence no RF current flows. Therefore, this surface coil is always decoupled from the homogeneous coil 109 arranged outside the surface coil. In this case, however, the homogeneous coil 109 must generate a spatially sufficient homogeneous RF field in the region in which the surface coil constituted by the differential coil is arranged.

Published Unexamined Japanese Patent Application No. 62-41651 discloses a technique of using a differential coil as a surface coil. The S/N ratio of this differential surface coil is substantially the same as that of a normal surface coil constituted by a one-turn coil if noise components from an object to be examined are dominant. However, in the case in which the RF loss of the differential surface coil itself cannot be neglected, its S/N is lower than that of a normal surface coil. For this reason, when such a surface coil is to be actually manufactured and arranged, the distance between the surface coil and an object to be examined and the distance between the two coils 141 and 142 must be fully taken into consideration.

Methods of performing decoupling between adjacent surface coils will be described below with reference to FIGS. 20 to 23. In this case, each of the surface coils 110a to 110f is constituted by the above-described differential coil. FIGS. 20 and 21 show decoupling methods employed when the adjacent surface coils constituted by the differential coils (110a and 110b in the FIGS. 20 and 21) are two-dimensionally arranged. FIGS. 22 and 23 show decoupling methods employed when the surface coils 110a and 110b are arranged on a circumference.

FIG. 20 shows a case wherein decoupling is performed by overlapping the two differential surface coils 110a and 110b within a plane by an area S determined by an area surrounded by the coils. U.S. Pat. No. 4,825,162 discloses a similar decoupling method applied for one turn coils. FIG. 21 shows a case wherein decoupling is performed by shifting the coils 110a and 110b in the axial direction (a direction perpendicular to a surface surrounded by the coil conductors) by an amount d. FIG. 22 shows a modification of the method shown in FIG. 20. More specifically, when the differential surface coils 110a and 110b are bent and arranged on a circumference, an area S' of an overlapping portion between the outer coils 141 differs from an arc S" of an overlapping portion between the inner coils 142. In this case, however, decoupling can be performed by arranging the coils 110a and 110b at specific positions where S">S>S' can be satisfied. FIG. 23 shows a modification of the method shown in FIG. 21. In this case, the coils 141 and 142 are arranged at an angle $\theta$. In this modification, decoupling can be realized by adjusting one differential surface coil 110b in x and y directions shown in FIG. 23.

In all these decoupling methods, when a current flows in one differential surface coil, magnetic fields crossing the adjacent differential surface coil amount to 0 in intensity. As described above, decoupling can be performed in various arrangements. This is another characteristic feature of a differential surface coil.

A method of performing decoupling between surface coils which are not adjacent to each other will be described below. A coupling effect between surface coils which are not adjacent to each is smaller than that between adjacent surface coils. For this reason, decoupling between surface coils which are not adjacent to each other is not strictly performed. Decoupling may be satisfactorily performed in consideration of the fact that the influences of coupling can be suppressed by reducing an apparent Q (quality factor). More specifically, a Q damp circuit may be added to each differential surface coil.

FIG. 24 shows a Q damp circuit, in which a coil 150 is constituted by an inductance L and a capacitance C and is designed to resonate at a specific frequency $f_0$. Then the matching capacitance is not necessary. A parallel resistance Rp represents the impedance of the coil 150 in a resonant state, and can be represented by the following equation using the Q value:

$$Rp = 2\pi f_0 L Q$$

Inverting and non-inverting input terminals of an amplifier 151 having a gain K are respectively connected to the two ends of the coil 150. In addition, a feed-back resistor 152 (having a resistance Rf) is connected between the output terminal and inverting input terminal of the amplifier 151, and the output terminal and non-inverting input terminal of the amplifier 151 are used as external connecting terminals. In practice, the preamplifiers 131a to 131f in FIG. 17 are used as the amplifier 151.

FIG. 25 shows an equivalent circuit of the Q damp circuit constituted by the coil 150, the amplifier 151, and the feedback resistor 152 shown in FIG. 24. A resistance Rd in FIG. 25 is given by $$Rd = Rf/(K+1)$$

Therefore, if the gain K of the amplifier 151 is sufficiently increased, Rp>>Rd. By reducing the impedance across the coil 150, the apparent Q value can be reduced.

In practice, a coupling effect between differential surface coils which are not adjacent to each other may be sufficiently small depending on the arrangement of surface coils. In such a case, no Q damp circuit is required.

If decoupling between the homogeneous coil 109 and the surface coils 110a to 110f and between adjacent surface coils is not sufficiently performed due to the shapes and arrangement of coils, Q damp circuits are preferably arranged in the surface coils 110a to 110f.

An imaging sequence for realizing a high S/N in this embodiment will be described in detail below. As an example, an imaging sequence for obtaining a two dimensional image will be described below. Similar to the first embodiment, this imaging sequence employs a pulse sequence for obtaining a two-dimensional image by a spin echo method using 90°-180° pulses as RF pulses.

RF pulses are applied by using the homogeneous coil 109, and MR signals are received by using the homogeneous coil 109 and all the surface coils 110a to 110f (multiple surface coil 110). The MR signals detected by the receiving section 111 through the coils 109 and 110a to 110f are fetched, as data used for image reconstruction, by the computer 113 through the data acquisition section 112. The data are then subjected to two dimensional Fourier transform in the computer 113 so as to perform image reconstruction. With this image reconstruction, image data of one channel are obtained through the homogeneous coil 109, and image data of a plurality of channels (six channels in this case) are obtained through the surface coils 110a to 110f. The six-channel image data obtained through the surface coils 110a to 110f are weighted and added by using a predetermined weighting function so as to maximize the S/N. With this operation, one-image data is synthesized. In addition, when an image obtained by the homogenous coil superimposes on an image obtained by the surface coils, an image having a high S/N can be obtained.

In consideration of the fact that noise detected by the coils is mostly inductive noise from the object 105, in the case of weighting/adding the absolute images, the above-mentioned weighting function can be given by the following equation:

$$k(R) = -\lambda(R)[H_{ij}]^{-1}h(R) \tag{11}$$

where $H_{ij}$: matrix element.

$$k(R) = \begin{bmatrix} k_1(R) \\ \cdot \\ \cdot \\ k_i(R) \\ \cdot \\ \cdot \end{bmatrix}$$

$$h(R) = \begin{bmatrix} h_1(R) \\ \cdot \\ \cdot \\ h_i(R) \\ \cdot \\ \cdot \end{bmatrix}$$

$$\lambda(R) = -\frac{C}{\{[H_{ij}]^{-1}h(R)\}h(R)} \tag{12}$$

where C: arbitrary constant.

$$h_{ij} = \int_v E_i(r) \cdot E_j(r) dv \cos(\theta_{ij}(r)) \tag{13}$$

where R is a position vector representing the position of a pixel (pixel position) on an image, r is a vector representing the position of the object to be examined in a given space, $k_i(R)$ is a weighting function for image data obtained by an ith surface coil; $h_i(R)$ is an RF field distribution generated by the ith surface coil, $E_i(r)$ is the electric field defined by the ith surface coil when supplied a predetermined RF current, $\lambda(R)$ is a correction function for correcting sensitivity distribution of image data, obtained upon weighting/adding processing, due to the RF field distribution of the surface coil, and $\theta_{ij}(r)$ is the angle defined by RF fields generated by the ith surface coil and a jth surface coil at the position r. In addition, integration of $H_{ij}$ is performed for the entire object.

Noise from each coil includes noise of an RF resistance caused by the coil itself, and dielectric or induced noise from the object. While the coils are attached to the object, most noise comes from the object. If noise caused by each coil itself cannot be neglected, the influences of the noise may be considered by changing diagonal elements of the matrix $[H_{ij}]$. In practice, since the non-diagonal elements of the matrix $[H_{ij}]$ are smaller in value than diagonal elements, a weighting function may be simply obtained by setting the non-diagonal elements to be 0.

In order to determine the weighting function k(R), the RF field distributions h(R) of the surface coils 110a to 110f must be obtained. This operation will be described below. h(r) can be approximately replaced with h(R). Phase correction of image data respectively obtained through the homogeneous coil 109 and the surface coils 110a to 110f is performed first. Assume that an image shown in FIG. 26 is obtained by using the homogeneous coil 109. Referring to FIG. 26, a solid line indicates the position of the homogeneous coil 109, and a dotted line indicates the position of the surface coil 110a.

Figure 27D:
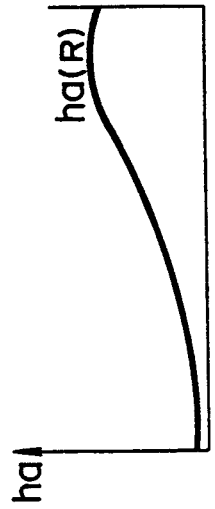
FIGS. 27A to 27D are graphs for explaining a method of obtaining the distributions of RF fields generated by the surface coils.
Figure 27B:
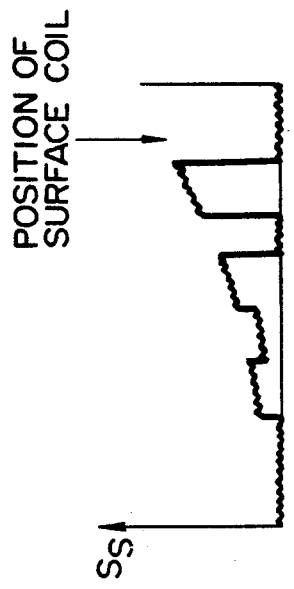
Figure 27C:
Figure 27A:
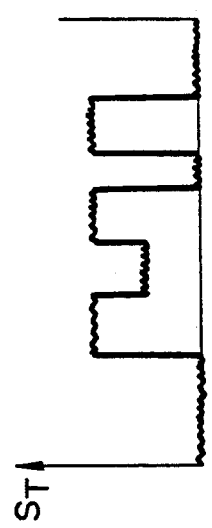

FIG. 27A shows a histogram of the image at a line A in FIG. 26. FIG. 27B shows a histogram at the same line of an image obtained by the surface coil 110a. In each of FIGS. 27A and 27B, the axis of abscissa represents a position, and the axis of ordinate represents signal intensities $S_T$ and $S_S$ in the respective images. As is apparent from FIG. 27B, the image sensitivity obtained by the surface coil 110a is reduced in with an increase in distance from the surface coil 110a. Note that if the S/N of an image is low, proper smoothing processing such as moving average processing is preferably performed.

Subsequently, a signal intensity ratio ha ($=S_S/S_T$) at a target portion of the object 105 is obtained. FIG. 27C shows a result obtained by calculating the signal intensity ratio ha at the line A in FIGS. 27A and 27B. Since image data are omitted from points where no signal sources are present and no signals are extracted due to the influences of a relaxation time and the like, processing such as interpolation is performed. Since an RF field distribution generated by a surface coil can be expanded by orthogonal functions, coefficients of the respective terms of an orthogonal function system may be determined by last square method using already obtained image data. With these methods, an RF field distribution ha(R) of the entire imaging region of the surface coil 110a, which is represented by a histogram ha(R) in FIG. 27D, can be obtained. Note that the signal intensity distribution ratio ha ($=S_S/S_T$) of the target portion of the object 105 as indicated by the histogram in FIG. 27C may be simply used as the RF field distribution ha(R).

If the RF field distribution of the homogeneous coil 109 becomes inhomogeneous, in the image obtained through the homogeneous coil 109, due to the influences of the object 105 and the like, the RF field distribution of the homogeneous coil 109 must be obtained in advance.

In the above-described embodiment, the differential coils are used as the surface coils, and decoupling between the respective surface coils 110a to 110f is performed by adjusting the arrangement thereof. Other various decoupling methods are also available. For example, the decoupling circuit shown in FIGS. 4A to 7 may be used.

Figure 28:
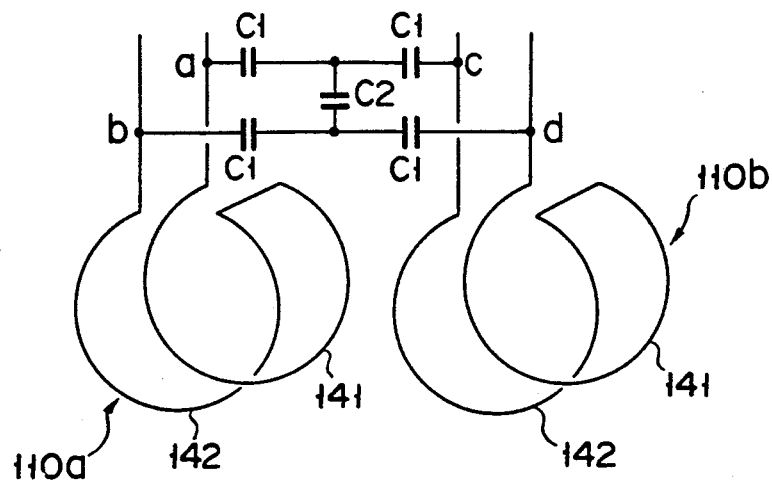
FIG. 28 is a view showing a method of performing decoupling between surface coils by using capacitors.

FIG. 28 shows a case wherein the decoupling circuit described with reference to FIGS. 4A to 7 is applied to decoupling between the surface coils 110a and 110b constituted by the differential coil shown in FIG. 18.

Figure 29:
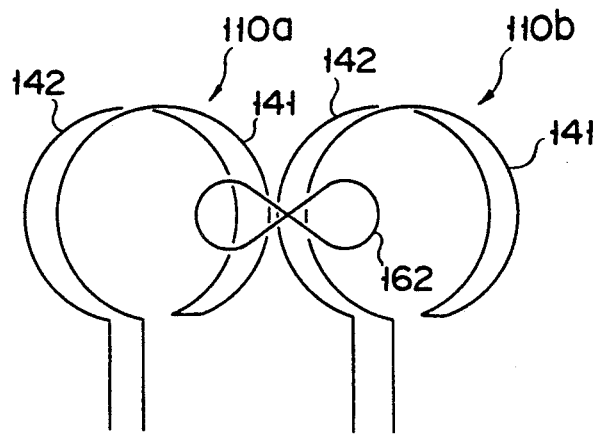
FIGS. 29 and 30 are views showing a method of decoupling surface coils by using decoupling coils.
Figure 30:
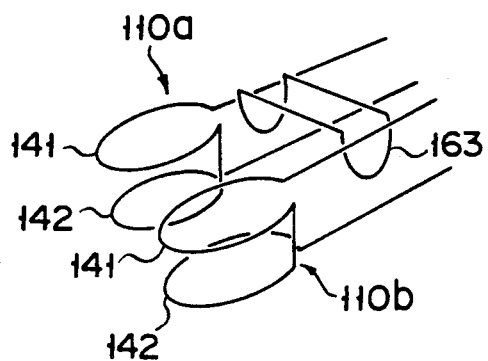

FIG. 29 shows a case wherein a decoupling coil 162 constituted by the butterfly (figure-8-shaped) coil described with reference to FIG. 9 is used. The butterfly decoupling coil 162 is coupled to surface coils 110a and 110b constituted by differential coils, and the surface coils 110a and 110b are decoupled in substantially the same manner as described with reference to FIG. 9. The decoupling coil 162 is a butterfly coil, and can realize a decoupling state with respect to the homogeneous coil 109. FIG. 30 shows a case wherein a decouping coil 63 is coupled to surface coils 110a and 110b constituted by differential coils, and the coils 110a and 110b are decoupled in the same manner as described above. In this case, the decoupling coil 163 may be coupled to the homogeneous coil 109 depending on the direction of an RF field generated by the homogeneous coil 109. Therefore, in practice, a careful consideration must be given to the arrangement of the decoupling coils, or the decoupling coils are preferably located at a distance from an object to be examined.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging system comprising:
magnetic field applying means for applying a static field, gradient field pulses, and an RF magnetic field to an object to be examined so as to cause magnetic resonance in an imaging region of the object;
a plurality of signal detecting means, including a plurality of surface coils, for detecting magnetic resonance signals from the object through said surface coils;
inverse Fourier transforming means for inverse Fourier transforming a plurality of weighting functions which are defined for each of said plurality of surface coils as a plurality of spatial position functions;
convolution integration means for performing convolution integration of the magnetic resonance signals respectively detected by said plurality of signal detecting means and results of said inverse Fourier transforming means;
synthesizing means for additively synthesizing convolution integration results obtained by said convolution integration means; and
imaging means for obtaining an image of the imaging region by performing Fourier transform of data obtained by said synthesizing means.

2. A system according to claim 1, wherein the weighting function is a function proportional to a spatial distribution of an RF field generated when an RF magnetic current flows in each of said surface coils.

3. A system according claim 1, further comprising means for measuring the weighting function prior to imaging.

4. A system according to claim 1, further comprising means for calculating the weighting function by a simulation based on an arrangement of said surface coils.

5. A system according to claim 1, further comprising decoupling of means for performing decoupling said plurality of surface coils.

6. A system according to claim 1, wherein said plurality of signal detecting means include a plurality of A/D converters for digitizing the magnetic resonance signals detected through said plurality of surface coils upon sampling at a predetermined sampling interval, and simultaneously detect the magnetic resonance signals from said plurality of surface coils.

7. A system according to claim 1, wherein said plurality of signal detecting means include a plurality of A/D converters for digitizing the magnetic resonance signals detected through said plurality of surface coils upon sampling at a predetermined sampling interval, and repeatedly perform sequential sampling of the magnetic resonance signals from said plurality of surface coils at the sampling interval within a magnetic resonance signal observation time.

8. A magnetic resonance imaging system comprising:
   static field applying means for applying a static field to an object to be examined;
   gradient field applying means for applying a static field pulses to the object;
   a homogeneous coil for transmitting/receiving an RF magnetic field, said homogeneous coil being arranged to correspond to a desired imaging region of the object and having RF magnetic field distribution characteristics within a predetermined region;
   transmitting means for applying an RF magnetic field to the object through said homogeneous coil;
   a plurality of surface coils arranged inside said homogeneous coil;
   signal detecting means for detecting magnetic resonance signals generated in the object through said homogeneous coil and said plurality of surface coils;
   image processing means for performing image processing includes image reconstruction of the magnetic resonance signals detected by said signal detecting means and respectively corresponding to said homogeneous coil and said plurality of surface coils, and generating image data for a plurality of channels respectively corresponding to said homogeneous coil and said plurality of surface coils;
   weighting function detecting means for obtaining a weighting function as a pixel position function for at least each of said plurality of surface coils by using the image data of the plurality of channels corresponding to said homogeneous coil and said plurality of surface coils; and
   synthesizing means for obtaining an image of the desired region using the weighting functions by performing weighting/adding operations of pixel data corresponding to the image data of the plurality of channels which correspond to at least said surface coils.

9. A system according to claim 8, wherein said weighting function determining means obtains RF magnetic field distributions of said plurality of surface coils by using the image of the plurality of channels respectively corresponding to said homogeneous coil and said plurality of surface coils, and determines the weighting functions on the basis of the RF magnetic field distributions.

10. A system according to claim 8, further comprising decoupling means for decoupling at least adjacent coils of said plurality of surface coils.

11. A system according to claim 10, wherein said decoupling means includes a figure-8-shaped coil which is arranged to overlap said adjacent coils so as to cancel a coupled magnetic flux.

12. A system according to claim 10, wherein said decoupling means includes a loop-like coil which is arranged to overlap said adjacent coils so as to cancel a coupled magnetic coupled.

13. A system according to claim 8, further comprising decoupling means for decoupling at least some of said plurality of surface coils and said homogeneous coil.

14. A system according to claim 8, further comprising decoupling means for decoupling at least the adjacent coil of said plurality of surface coils and at least some of said plurality of surface coils and said homogeneous coil.

15. A system according to claim 8, wherein at least some of said plurality of surface coils are constituted by a differential coil having a pair of identical coils arranged to be coaxial and parallel to each other, said pair of coils being connected to cause currents to flow in opposite directions.

16. A system according to claim 15, wherein said weighting function determining means obtains RF magnetic field distributions of at least said plurality of surface coils by using the image of the plurality of channels respectively corresponding to said homogeneous coil and said plurality of surface coils, and determines the weighting functions on the basis of the RF magnetic field distributions.

17. A system according to claim 15, further comprising decoupling means for decoupling at least adjacent coils of said plurality of surface coils.

18. A system according to claim 17, wherein said decoupligcn means includes a figure-8-shaped coil which is arranged to overlap said adjacent coils so as to cancel a coupled magnetic coupled.

19. A system according to claim 17, wherein said decoupling means includes a loop-like coil which is arranged to overlap said adjacent coils so as to cancel a coupled magnetic coupled.

20. A system according to claim 17, further comprising decoupling means for decoupling at least some of said plurality of surface coils and said homogeneous coil.

21. A system according to claim 10, wherein said decoupling means includes a bridge circuit which is arranged to connect said adjacent coils so as to cancel a coupled magnetic flux.

22. A magnetic resonance imaging system comprising:
   magnetic field applying means for applying a static field, gradient field pulses, and an RF magnetic field to an object to be examined so as to cause magnetic resonance in an imaging region of the object;
   signal detecting means, including a plurality of surface coils which are arranged such that linked magnetic field of the RF magnetic fields generated by at least adjacent coils of said surface coils amount to zero in intensity, and decoupling is performed between at least said adjacent coils, for detecting magnetic resonance signals from the object through sad surface coils, each of said surface coils being constituted by a differential coil having a pair of identical coils which are arranged to be substantially coaxial and are connected to cause currents to flow in opposite directions;
   inverse Fourier transforming means for inverse Fourier transforming a plurality of weighting functions which are defined by each of said plurality of surface coils as a plurality of spatial position function;
   convolution integration means for performing convolution integration of the magnetic resonance signals respectively detected by said plurality of signal detecting means and results of said inverse Fourier transforming means;
   synthesizing means for additively synthesizing convolution integration results obtained by said convolution integration means; and
   imaging means for obtaining an image of the imaging region by performing Fourier transform of data obtained by said synthesizing means.

23. A magnetic resonance imaging system comprising:
- magnetic field applying means for applying a static field, gradient field pulses, and an RF magnetic field to an object to be examined so as to cause magnetic resonance in an imaging region of the object;
- a plurality of signal detecting means, including a plurality of surface coils, for detecting magnetic resonance signals from the object through said surface coils;
- a figure-8-shaped coil which is arranged to overlap at least adjacent coils of said plurality of surface coils, for decoupling said adjacent coils so as to cancel a coupled magnetic flux;
- inverse Fourier transforming means for inverse Fourier transforming a plurality of weighting functions which are defined for each of said plurality of surface coils as a plurality of spatial position functions;
- convolution integration means for performing convolution integration of the magnetic resonance signals respectively detected by said plurality of signal detecting means and results of said inverse Fourier transforming means;
- synthesizing means for additively synthesizing convolution integration results obtained by said convolution integration means; and
- imaging means for obtaining an image of the imaging region by performing Fourier transform of data obtained by said synthesizing means.

24. A magnetic resonance imaging system comprising:
- magnetic field applying means for applying a static field, gradient field pulses, and an RF magnetic field to an object to be examined so as to cause magnetic resonance in an imaging region of the object;
- a plurality of signal detecting means, including a plurality of surface coils, for detecting magnetic resonance signals from the object through said surface coils;
- a loop-like coil which is arranged to overlap at least adjacent coils of said plurality of surface coils, for decoupling said adjacent coils so as to cancel a magnetic flux coupled;
- inverse Fourier transforming means for inverse Fourier transforming a plurality of weighting functions which are defined for each of said plurality of surface coils as a plurality of spatial position functions;
- convolution integration means for performing convolution integration of the magnetic resonance signals respectively detected by said plurality of signal detecting means and results of said inverse Fourier transforming means;
- synthesizing means for additively synthesizing convolution integration results obtained by said convolution integration means and corresponding to said plurality of signal detecting means; and
- imaging means for obtaining an image of the imaging region by performing Fourier transform of data obtained by said synthesizing means.

* * * * *